United States Patent [19]

McCallum et al.

[11] Patent Number: 4,939,786

[45] Date of Patent: Jul. 3, 1990

[54] ADAPTIVE THERMAL PROTECTION FOR A POWER AMPLIFIER BY REMOTE SENSE

[75] Inventors: Kevin J. McCallum, Algonquin, Ill.; Leland B. Arms, Keller, Tex.

[73] Assignee: Motorola, Inc., Schaumburg, Ill.

[21] Appl. No.: 23,758

[22] Filed: Mar. 9, 1987

[51] Int. Cl.⁵ .................. H04B 17/00; H03C 1/52
[52] U.S. Cl. ..................... 455/67; 455/115; 455/117; 455/127; 330/207 P
[58] Field of Search ................. 455/115–117, 455/127; 330/278–280, 284, 298, 138, 139, 207 P; 340/584, 588, 589; 328/84, 8; 307/310; 324/105, 123 R; 364/176; 361/25

[56] References Cited

U.S. PATENT DOCUMENTS

| | | |
|---|---|---|
| 4,019,150 | 4/1977 | Lurey et al. |
| 4,041,396 | 8/1977 | Fedde |
| 4,131,860 | 12/1978 | Fyot |
| 4,146,847 | 3/1979 | Otao et al. |
| 4,157,513 | 6/1979 | Ghiringhelli et al. |
| 4,158,180 | 6/1979 | Challen ................ 455/117 |
| 4,158,180 | 6/1979 | Challen |
| 4,313,210 | 1/1982 | Hume et al. |
| 4,367,443 | 1/1983 | Hull et al. |
| 4,412,337 | 10/1983 | Bickley et al. ........ 455/126 |
| 4,523,155 | 6/1985 | Walczak et al. |
| 4,534,406 | 8/1985 | Newell et al. ........ 340/588 |
| 4,563,775 | 1/1986 | Yoksuka ............... 455/126 |
| 4,593,409 | 6/1986 | Miller .................. 455/117 |
| 4,647,219 | 3/1987 | Figler et al. ......... 340/588 |
| 4,709,403 | 11/1987 | Kikuchi ............... 455/117 |
| 4,727,337 | 2/1988 | Janson ................. 455/117 |

OTHER PUBLICATIONS

Berlox Application Note, Section 4, Thermal Design of Beryllia Components, National Beryllia Corp., Haskell, NJ, published Between 1959–present, pp. 9, and 13–36.
Thermal Considerations in Power Amplifiers, Communications Magazine, Feb., 1987, pp. 44–553.

Primary Examiner—Reinhard J. Eisenzopf
Assistant Examiner—Curtis Kuntz
Attorney, Agent, or Firm—Ronald G. Wesolowski; John W. Hayes

[57] ABSTRACT

An adaptive thermal protection method and arrangement for a power amplifier by remote sense is disclosed which maximizes the amount of output power from electronic equipment such as a radio frequency (RF) power amplifier, having a finite heat sink and operating intermittently over a period of time. This method and apparatus utilizes a remote temperature sensor and knowledge of the on/off, or key/dekey times in conjunction with a stored, predetermined thermal model to adjust the operating power level to a maximum permissible point within a range of operating power levels such that the projected temperature of the power amplifier does not exceed a preset limit. In so doing, the apparatus and method combines the advantages of thermal protection and power maximazation and effects gradual changes in the operating power level by adapting to variable environmental and operational conditions.

22 Claims, 9 Drawing Sheets

ADAPTIVE THERMAL PROTECTION FOR A POWER AMPLIFIER BY REMOTE SENSE

BACKGROUND OF THE INVENTION

The present invention relates generally to protection circuitry for a power amplifier, and more particularly to an improved method and arrangement for maximizing the amount of output power from a radio frequency (RF) power amplifier which has a relatively small, or finite heatsink and which is operated intermittently over a period of time.

In general, for RF power amplifiers having transistors, 200° C. represents a critical level of temperature for the devices. Moreover, for a radio operating in a mobile environment, it is often impractical to implement unlimited cooling for the RF power amplifier. In reality, most mobile radio applications operate with relatively little cooling due to the lack of circulating air and a relatively small, or finite-sized heatsink. As a result, this translates into a maximum heatsink temperature of 100° C. in order to avoid seriously reducing the life of the devices. Therefore, the heat-dissipating devices within the RF power amplifier must be provided with some form of thermal protection to insure that the devices never exceed such critical temperatures.

Previously known power amplifiers typically have only one or two output power levels, with an elementary thermal protection circuit causing the RF power amplifier to switch to a lower power level upon sensing the temperature of various critical components (e.g., power output transistors) when the temperature of these components rises to a critical level.

In radios operating over a narrow band of frequencies, such thermal protection often merely takes the form of a thermal shutback switch or circuit, while in radios operating over a wide band of operating frequencies, previously known arrangements utilize both a temperature compensation circuit and a thermal shutback circuit. The temperature compensation circuit provides leveling of the output power for relatively large changes in frequency, while the thermal shutback circuit provides abrupt thermal shutback in the event of extreme operating conditions caused by high ambient temperatures or lengthy operation of the transmitter, as is encountered during continuous keyed operation.

However, such elementary forms of thermal protection for a power amplifier can create serious problems when the ambient temperature adjacent to the finite heatsink on which the power amplifier is mounted is already high, due to high surrounding air temperature or extremely long transmit (keyed) operating times. Such conditions may cause the transmitter to shut back to a fixed lower level that was preset to protect against every possible combination of worst-case operating conditions. During this shutback condition, the power output versus time characteristic may exhibit "ringing" as the temperature crosses over the threshold, and furthermore, the transmitter may produce so little output power during shutback that the quality of communications with desired receivers is jeopardized.

Accordingly, there exists a need for improved thermal protection for a power amplifier by remote sense which provides the combined advantages of thermal protection and power maximization, and which is able to ensure a safe operating temperature for the transmitter with a minimum of additional components while effecting gradual changes in the operating power level for varying environmental and operational conditions.

SUMMARY OF THE INVENTION

It is an object of the present invention to provide an improved, thermal protection method and arrangement for a power amplifier which automatically determines an operating power level near a permissible maximum while insuring that its projected temperature does not exceed a preset limit and which overcomes the foregoing deficiencies.

It is a further object of the present invention to provide an improved thermal protection method and arrangement for a power amplifier of the foregoing type, utilizing a remote temperature sensor already located in an included reference oscillator and elapsed times associated with the key or dekey condition of the power amplifier, which effects gradual changes so that the operating power level may be set to a point near a permissible maximum while ensuring that the projected operating temperature does not exceed a preset limit, thereby ensuring a safe operating temperature while providing a maximum permissible level of operating output power.

In practicing one form of the invention, a mobile radio is described having a transmitter, a receiver, and a microcontroller. The transmitter comprises an exciter and an RF power amplifier whose output power is controlled by the microcontroller. The receiver includes a temperature compensated reference oscillator. A thermistor, which is part of the reference oscillator, provides an indication of present operating temperature as well as functioning to temperature compensate the reference oscillator. Although remote from the finite heatsink of the RF power amplifier, this thermistor and an included counter are utilized by the micocontroller to arrive at a projected temperature for the power amplifier. The microcontroller uses a stored thermal model to calculate a projected operating temperature that is kept within a preset limit, converting that into a corresponding permissible operating level. In so doing, the microcontroller maintains the operating power level point near a permissible maximum within a range of operating power levels, such that the projected temperature does not exceed a preset limit, thereby ensuring a safe operating temperature for the mobile radio while providing maximum utilization of the finite heatsink.

These and other objects of the present invention will become apparent to those skilled in the art upon consideration of the accompanying specification, claims, and drawings.

BRIEF DESCRIPTION OF THE DRAWINGS

Referring to the drawings, wherein like reference numerals indicate like elements in the several figures and in which.

DETAILED DESCRIPTION OF THE PREFERRED EMBODIMENT

Figure 1:
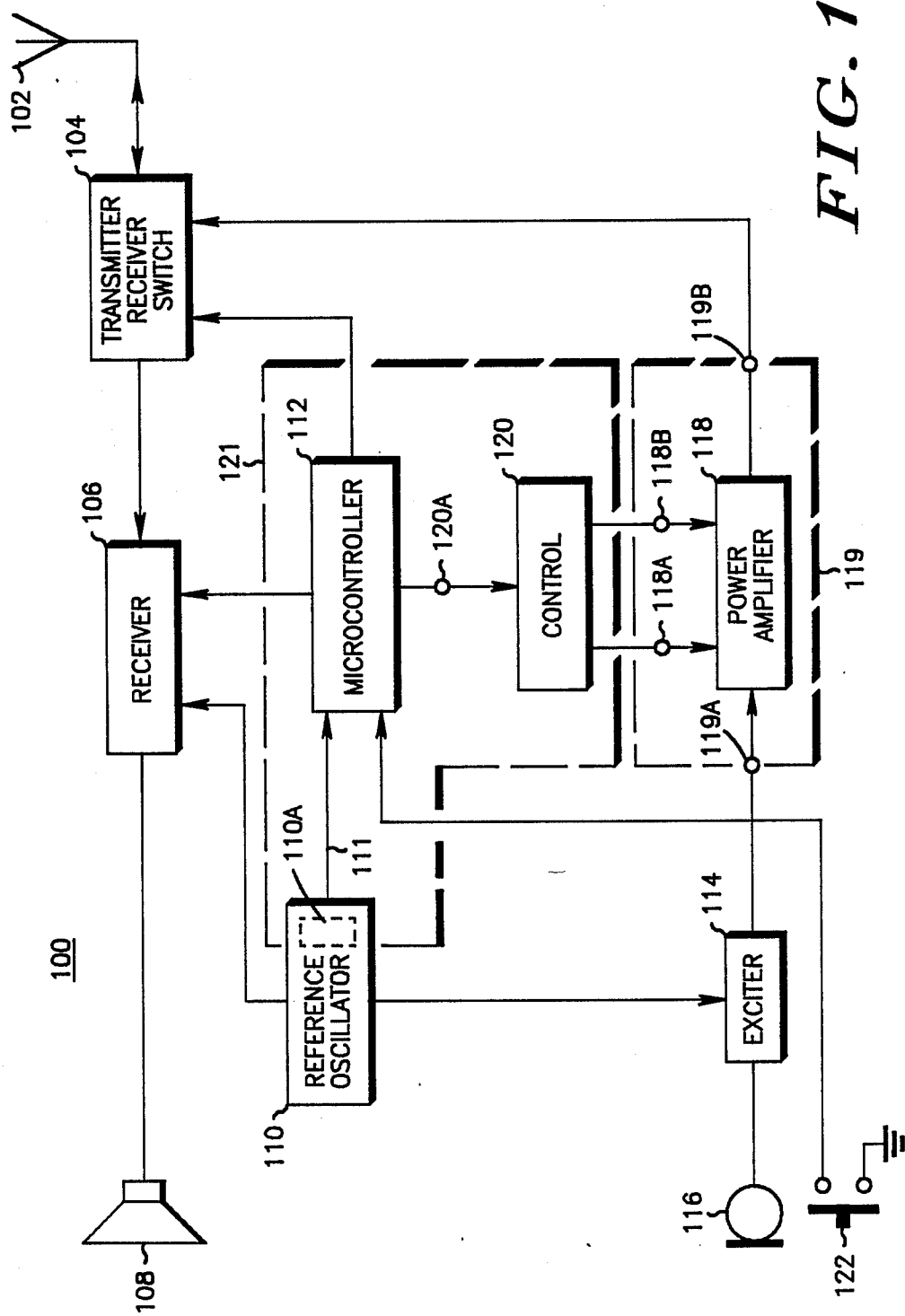
FIG. 1 is a block diagram of a mobile radio embodying the present invention.

Referring now to the drawings, FIG. 1 depicts a block diagram of mobile radio 100 which accommodates the method and arrangement of the present invention. Included is antenna 102 which couples to transmit/receive (T/R) switch 104. Coupled to T/R switch 104 is receiver 106, which then couples to speaker 108. Reference oscillator 110 provides a stable reference signal for receiver 106 and an indication of present operating temperature from internal temperature compensation circuitry 110a via line 111 to microcontroller 112. Reference oscillator 110 also provides the stable reference signal to exciter 114, which has microphone 116 at its input and power amplifier 118 on its output. Power amplifier control lines 118a and 118b are brought out to accessible points, or nodes, on finite heatsink 119. Finite heatsink 119 also has accommodations for nodes 119a and 119b for the RF input and RF output connections, respectively. Notably absent from the finite heatsink is a temperature sensor that is usually included in conventionally known thermal protection circuitry. Control circuitry 120 couples to power amplifier 118 via nodes 118a and 118b, as well as to microcontroller 112 via node 120a. The functional blocks outlined as 121, together with power amplifier 118 mounted on finite heatsink 119, are covered in more detail in FIG. 2.

Figure 2:
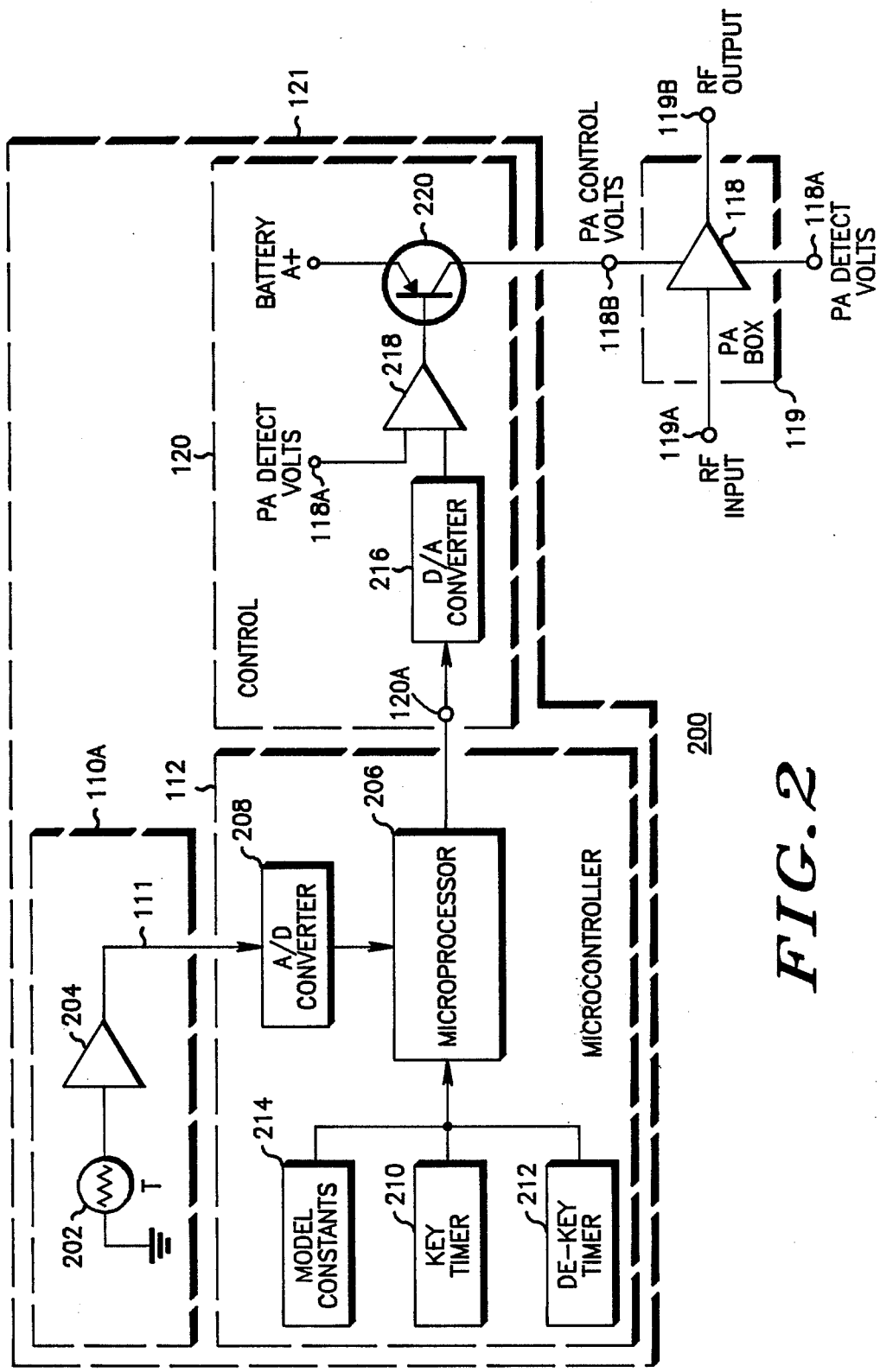
FIG. 2 is a more detailed block diagram showing the preferred embodiment of the present invention.

Turning now to FIG. 2, block diagram 200 depicts the exemplary embodiment of element 121, and its relation to power amplifier 118 within finite heatsink 119. Beginning in block 110a, thermistor 202 and stage 204 (which may be one or more operational amplifiers) are shown as part of temperature compensated reference oscillator 110 (not shown), with an output voltage or current indicative of present operating temperature available at line 111. This line (111) couples to microcontroller 112, which includes microprocessor 206, A/D converter 208, timers 210 and 212 acting as resettable counters, and memory block 214 having predetermined, stored, thermal model constants. The output from microcontroller 112 proceeds to node 120a, which is the input to control block 120. This control block contains D/A converter 216 comparator 218 and voltage control transistor stage 220. Although stage 220 is rendered as a single transistor, it may include a number of similar transistors paralleled together to provide an amount of current sufficient for power amplifier 118. Power amplifier 118 may consist of a chain of one or more amplifier stages, although rendered here as merely one stage for simplicity.

Figure 3:
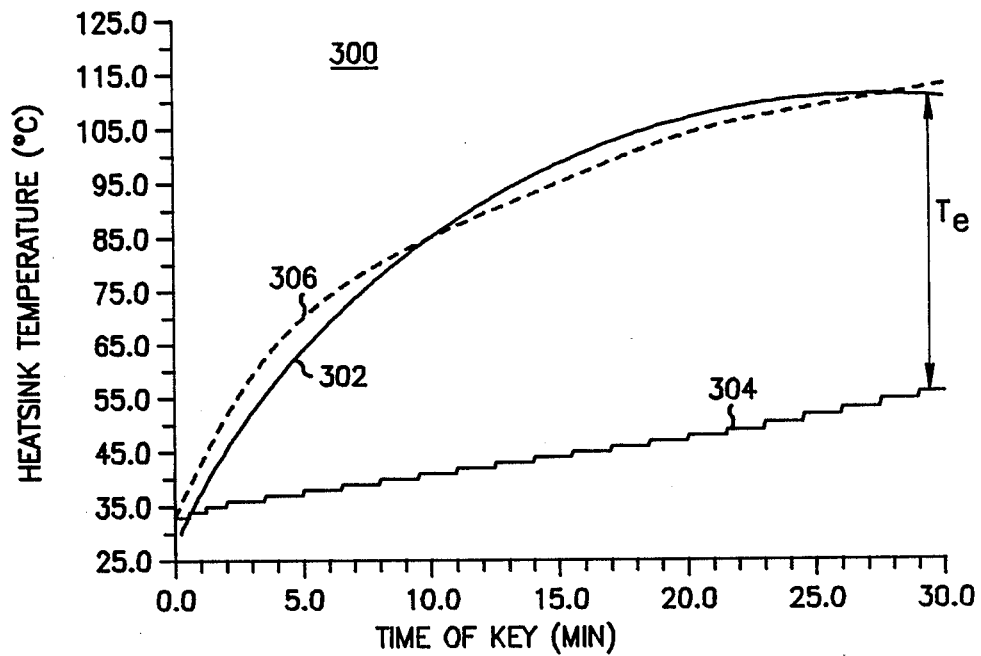
FIG. 3 depicts curves of the actual and calculated temperature/time characteristics of a heatsink mounted RF power amplifier in relation to the reference temperature, taken during constant key conditions, and useful in determining the thermal model constants needed for characterizing a particular radio.

Turning now to FIG. 3, a temperature versus time graph is shown at 300 which is useful in determining the thermal model constants that characterize a typical 25 watt mobile radio operating in a VHF frequency band. As shown, curve 302 represents the temperature as actually measured at the finite heatsink during controlled conditions with a constant key time period of about 29 minutes. Curve 304 represents the temperature response of a thermal sensor located within the reference oscillator and remote from the power amplifier. Curve 306 represents the calculated value of temperature for the power amplifier as projected by a thermal model based upon thermal constants derived from the relationship between Curves 302 and 304 of FIG. 3.

It is well known that heat flow can be analyzed with a thermal circuit in the same way that current flow can be analyzed with an electrical circuit. See chapter 12.9 of *Solid State Radio Engineering*, by Kraus, Bostian, and Raab, 1980, pp. 384-385. As a result, dissipated power is analogous to a current-source, temperatures are analogous to voltages, and each element in the thermal path has an associated thermal resistance. Moreover, any heat storage along this thermal path has an associated thermal capacitance which induces a thermal lag or time constant.

A first thermal constant, $T_{EQ}$, (equilibrium temperature) is derived from the temperature difference between Curves 302 and 304, $T_e$, as time t approaches infinity. [Note that at time t=29 minutes, Te=55° C., with an estimate of the asymptotic value of equilibrium temperature, $T_{EQ}$,=65° C.] A second thermal constant, $T_{CAP}$, describes the time lag associated with a change in temperature due to a heat wave originating from the heat-dissipating devices in the power amplifier (mounted on the heatsink) and arriving at the temperature sensor located remotely within the mobile radio. This time lag is analogous to an electrical resistance-capacitance time constant, often expressed as the Greek letter "tau". It will be apparent to those of skill in the art that this time lag can be determined empirically from Curve 302 by utilizing a curve-fitting routine. As will be seen shortly, once these two thermal constants, $T_{EQ}$ and $T_{CAP}$, are known, they can be used for characterizing the thermal response of the heat wave for a particular mobile radio having a fixed mass and a given amount of output power. Thus, the temperature difference between the PA and the reference sensor as a function of time can be described in general as:

(1) $T_{on} = T_{EQ}(1 - e^{-t/T_{CAP}})$, during key;

(2) $T_{off} = T_{ON}(e^{-t/T_{CAP}})$, during dekey, where $T_{ON}$ is the temperature difference existing at the end of the key interval, discussed later with respect to FIG. 5A. Although time constant $T_{CAP}$ is described as a constant, in fact it is a function of both the type of PA and the thermal resistance, $R_{th}$, which is a temperature variation factor dependent on ambient temperature. This dependency can be readily seen by breaking down $T_{CAP}$ into its constituent parts, thermal resistance and thermal capacitance.

In the example of a heatsink for a mobile radio rated at 25 watts, the thermal capacitance is calculated by knowing the volume, density, and specific heat of the material. Given a volume of 136.67 cubic centimeters of aluminum, and density of 2.7 grams per cubic centimeter, the mass equals 369 grams. Since the specific heat for aluminum is 0.22 Calories per gram °C., the thermal capacitance $C_{th}$, or mass specific heat, is:

$$C_{th} = 369 gm \times 0.22 \, cal/gm \, °C = 81.2 \, Cal/°C.,$$

which is a constant not dependent upon temperature.

On the other hand, the thermal resistance, $R_{th}$, corresponds to the loosely coupled thermal link between the major source of heat and the thermal mass of the mobile radio. This coupling is dependent on the ambient temperature. Solving equation (1) for $T_{CAP}$ yields a family of values which are related to a set of $R_{th}$ values by the constant $C_{th}$. As a result, there is one value of $R_{th}$ for conditions measured at $+30°$ C. and another value for conditions measured at $+60°$ C. However, the values of $R_{th}$ at these respective temperatures are sufficiently close that the value at $+30°$ C. can be used as a good approximation. Thus, with $R_{th}=3.33$, $T_{CAP}$ is fixed at 270 over the typical temperature range of $-30°$ C. to $+60°$ C. for a mobile radio, and the temperature difference between the PA and the reference sensor can be described in terms of equation (1) and (2) under all encountered conditions.

Although the above equations (1) and (2) can be incorporated into the mobile radio microcontroller in a number of ways, an analog solution was not chosen, since a digital microcontroller was already available. Thus, an approximation suitable for a digital controller had to be found which would give good results, without consuming vast amounts of storage and operating capability. Fortunately, such a task is readily done on a small computer. Approximations of various types were tried, including piece-wise linear, but the one which worked the best was based on the first few terms of a well-known infinite series approximation for the base of natural logarithms:

(3) $e^x = 1 + X + (x^2/2!) + (x^3/3!) + \ldots$ for $|x| < \infty$. See *Reference Data For Radio Engineers*, Fifth Edition, Howard W. Sams, Inc., 1972, p. 44-26. The approximation finally chosen utilizes the first two terms $(1+x)$, and was evaluated to test the concept over various temperature conditions, for a given mobile radio housing and heatsink. The advantage of such an approach is that a given housing and heatsink retain flexibility for programming different options by the designer. Such options may include fitting less-efficient 25 watt UHF radio circuitry in place of a 25 watt VHF (or low-band) radio circuitry, or offering a 50 watt PA mounted on the original heatsink that was sized for a 25 watt PA.

Regardless of the reasons for the variations, a stored value for $T_{EQ}$ and $T_{CAP}$ is all that is needed for each model. By temperature testing a number of PAs corresponding to the different models of mobile radios, these two thermal constants can readily be determined for each such option, or model, utilizing a common housing and heatsink.

As expected, several passes were required to arrive at a set of thermal constants in order to accurately predict the thermal response for the PA in the mobile radio. After a fourth pass, the values for the variables are:
$T_{EQ}=65°$ C., and
$T_{CAP}=270$.
Having these constants, the programmed microcontroller is ready to begin operation, either encountering continuous keyed conditions, or short duration keyed conditions, depending on the type and nature of the messages handled.

In operation, and assuming the radio is at ambient temperature initially, the mobile radio begins operation at full power. As the radio is subsequently operated with either long transmit durations or operated in an environment with high ambient temperatures, a heat wave effectively encroaches towards the remote temperature sensor located within the radio at the reference oscillator circuit elevated temperature in turn causes the microcontroller to calculate a projected future temperature for the PA, utilizing the thermal model and the stored thermal constants which characterize the mobile radio, such that the microcontroller adaptively cuts back the operating power level to a permissible maximum that corresponds to a safe operating temperature. The relationship between increasing temperature and power output is best seen in FIG. 4, while the operation during intermittent keyed conditions will be discussed in connection with FIGS. 5A and 5B.

Figure 4:
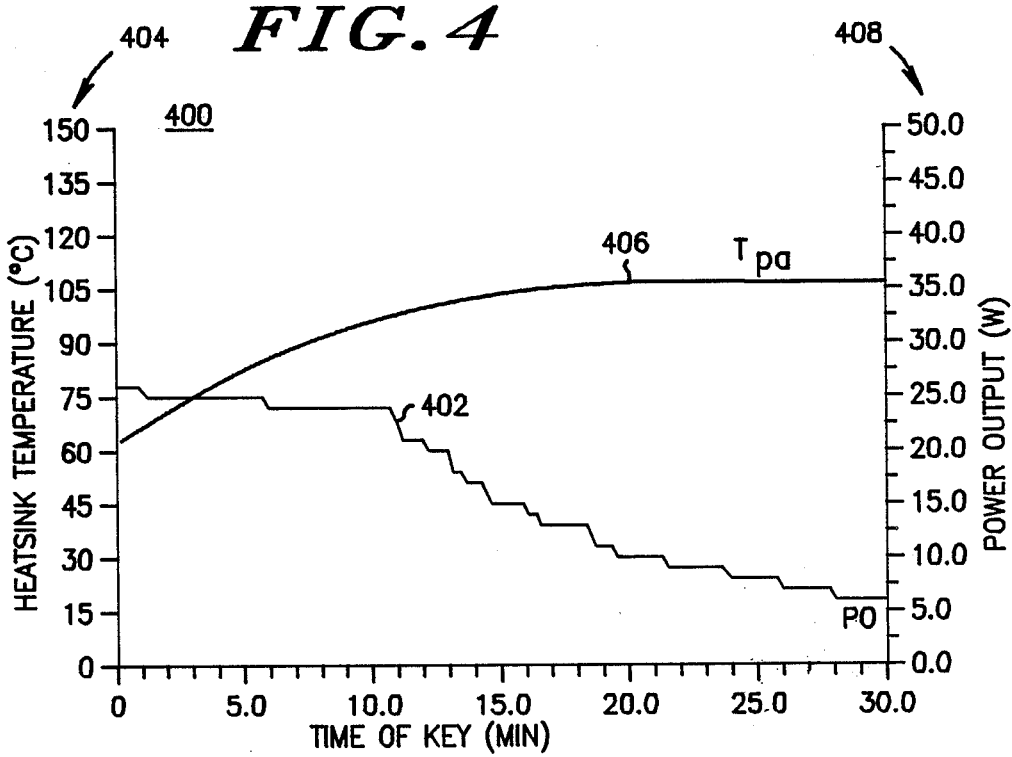
FIG. 4 depicts a curve of constant power output until shutback occurs.

Referring to FIG. 4, curves are shown at 400 which depict power output watts and power amplifier temperature as a function of time during constant key conditions. Curve 402 represents PA temperature measured along vertical axis 404, and Curve 406 represents power output measured with respect to axis 408. Note that as the temperature climbs, the power output is gradually reduced—slowly at first, then faster as the temperature approaches the limit of safe operating temperature of 100-105° C. Thus, for reasons previously mentioned, an abrupt change from a high power level to a very low power level is eliminated.

Figure 5A:
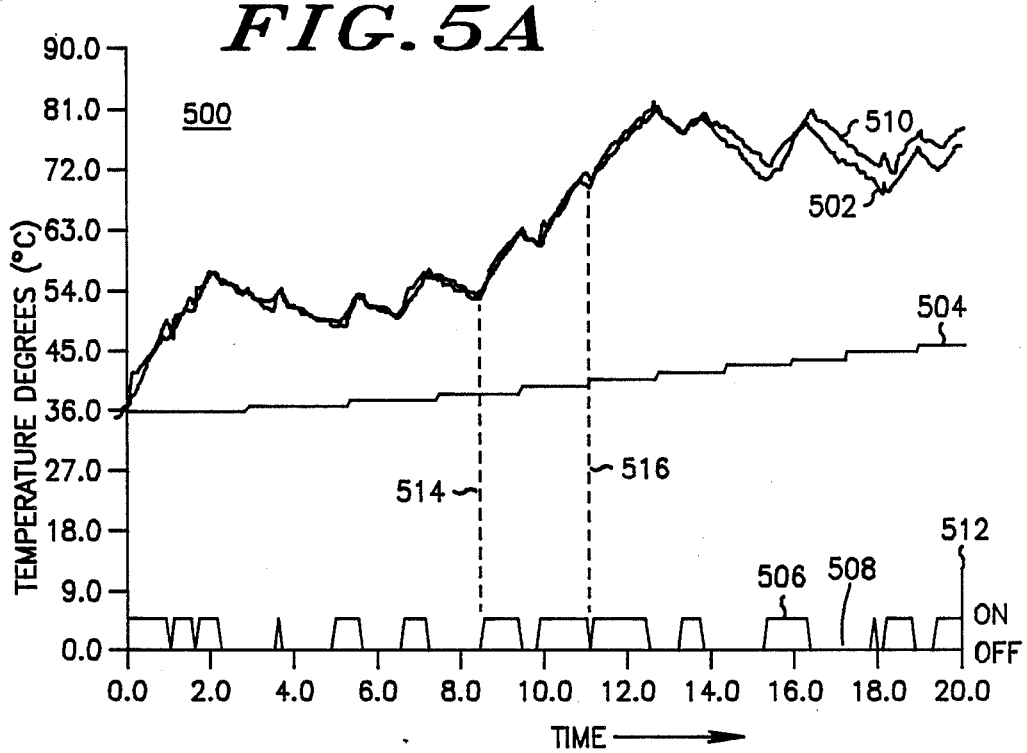
FIG. 5 and represent histograms for a randomly varying message sequence depicting how well the constants derived from FIG. 3 characterize the thermal response of the power amplifier during various on/off, or key/-dekey periods of time.

Next, turning to FIG. 5A, a temperature versus time graph is given at 500 which represents a histogram for a randomly varying message sequence. Curve 502 represents the calculated PA temperature projected by the preferred embodiment of the present invention, with respect to the reference temperature represented by Curve 504. Near the bottom base line of the chart, the randomly varying message sequence is represented by intervals of ON time, or keyed time, 06, as well as intervals of OFF time, or dekeyed time, 508. Actual PA temperature is represented by Curve 510, over the indicated test time interval of 20 minutes, 512. Before proceeding to the flowcharts, certain terms will need to be defined, and so a time interval defined by end points 514 and 516 were chosen to depict a magnified portion of curves 502 and 504 in FIG. 5B, which follows next.

Figure 5B:
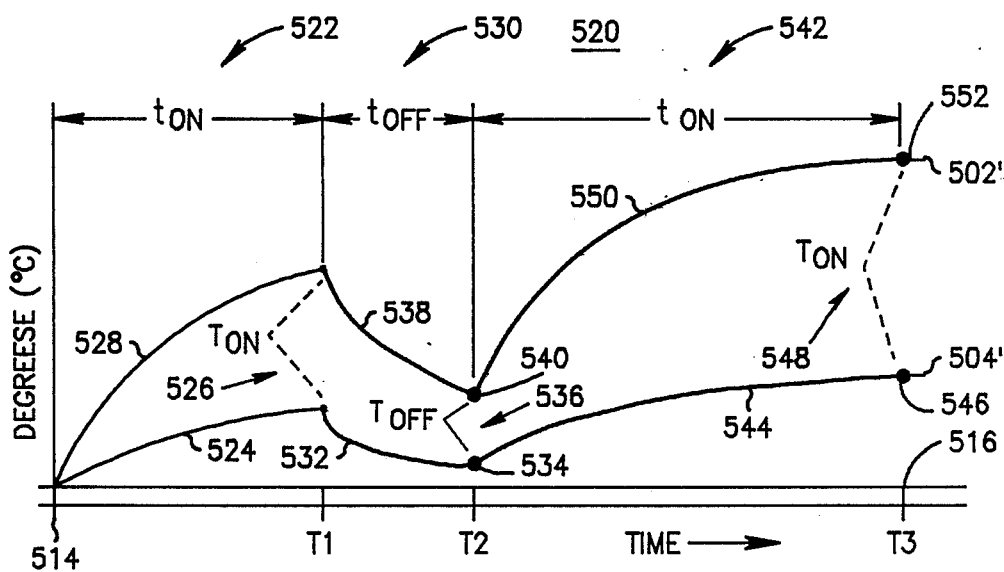

Referring next to FIG. 5B, a temperature versus time graph is shown at 520 for an interval of time between end points 514 and 516. Subinterval 522 depicts the rise in reference temperature 524, while the transmitter is keyed, or the PTT (push-to-talk) switch is activated. During this subinterval of time, a temperature difference above reference temperature is calculated and shown as 526 which, when added to the reference temperature denoted as 524, provides a projected temperature, or calculated PA temperature represented by Curve 528.

In contrast, during a dekeyed subinterval of time 530, corresponding to the transmitter PA being off, the reference temperature decreases along Curve 532, such that at time T2 the reference temperature is represented by point 534, which may be above the initial temperature point, as shown. At time T2 the method of the preferred embodiment next determines temperature difference 536 as $T_{off}$, based upon stored constants and knowing the length of time interval T1-T2. Then, adding the reference temperature associated with point 534 and temperature difference 536, the method determines a calculated PA temperature, TPA at any point along curve 538, and in this example at point 540.

Next, during time interval 542, corresponding to the transmitter being keyed, the reference temperature $T_{ref}$ is measured by the remote sensor during subinterval of time T2-T3 and follows Curve 544 to point 546. Again, calculating the temperature difference 548 above point 546 as $T_{on}$, a calculated PA temperature can be arrived at anywhere along Curve 550, such as that represented at point 552. Moreover, if the subinterval of time between T2 and T3 greatly exceeds the thermal time constant associated with the finite heat sink and the PA, such that point 552 nearly equals a preset limit, or a safe operating temperature, then the method will adjust the operating power level of the PA to a permissible point so that the projected temperature does not exceed the preset limit. In the preferred embodiment, this safe temperature preset limit equals approximately 100 degrees centigrade. An example of an instruction set for microcontroller 112 is described next in simplified flowchart form.

Figure 6A:
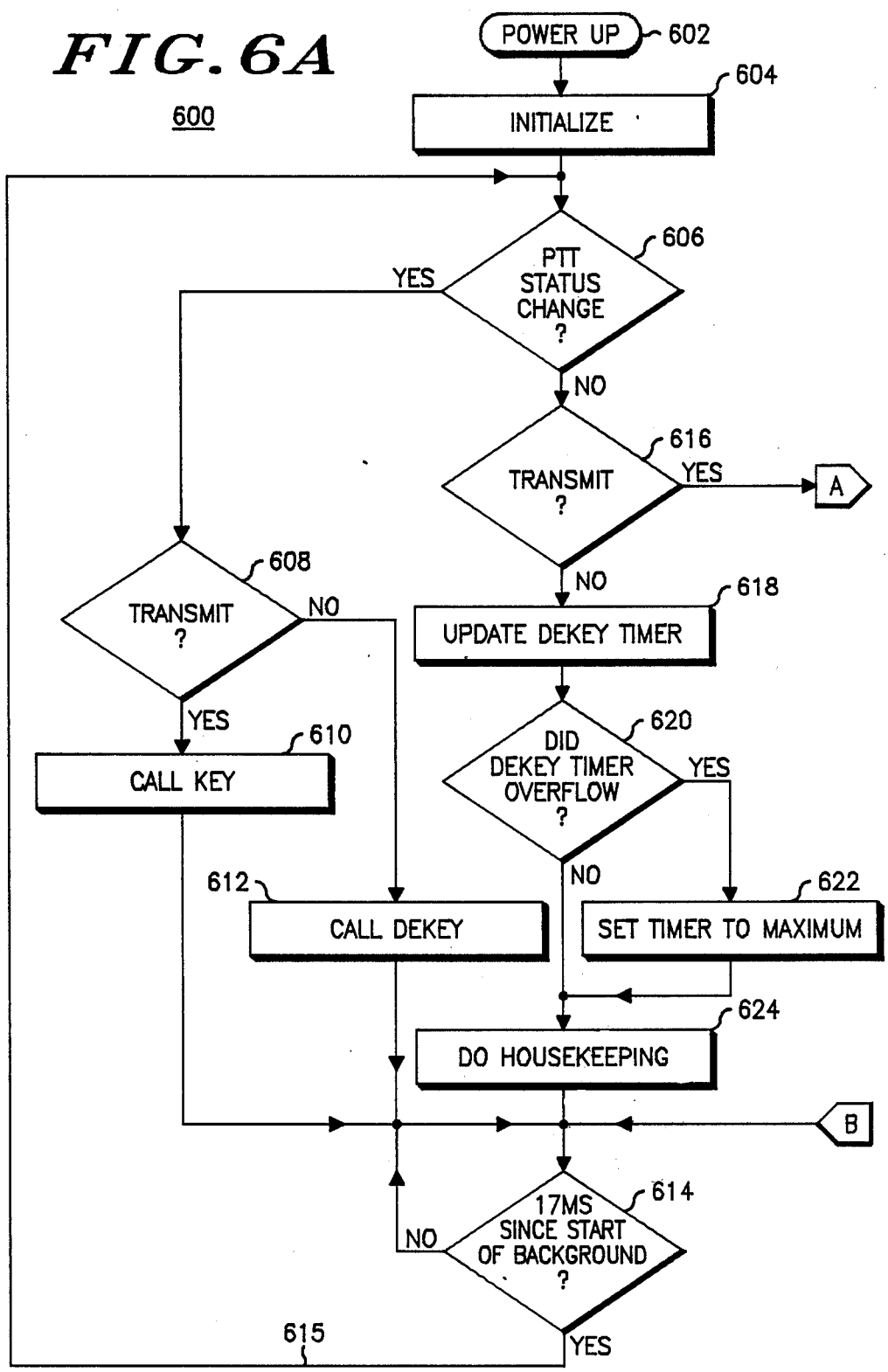
FIG. 6A and 6B depict a simplified flow chart summarizing the method o the preferred embodiment.
Figure 6B:
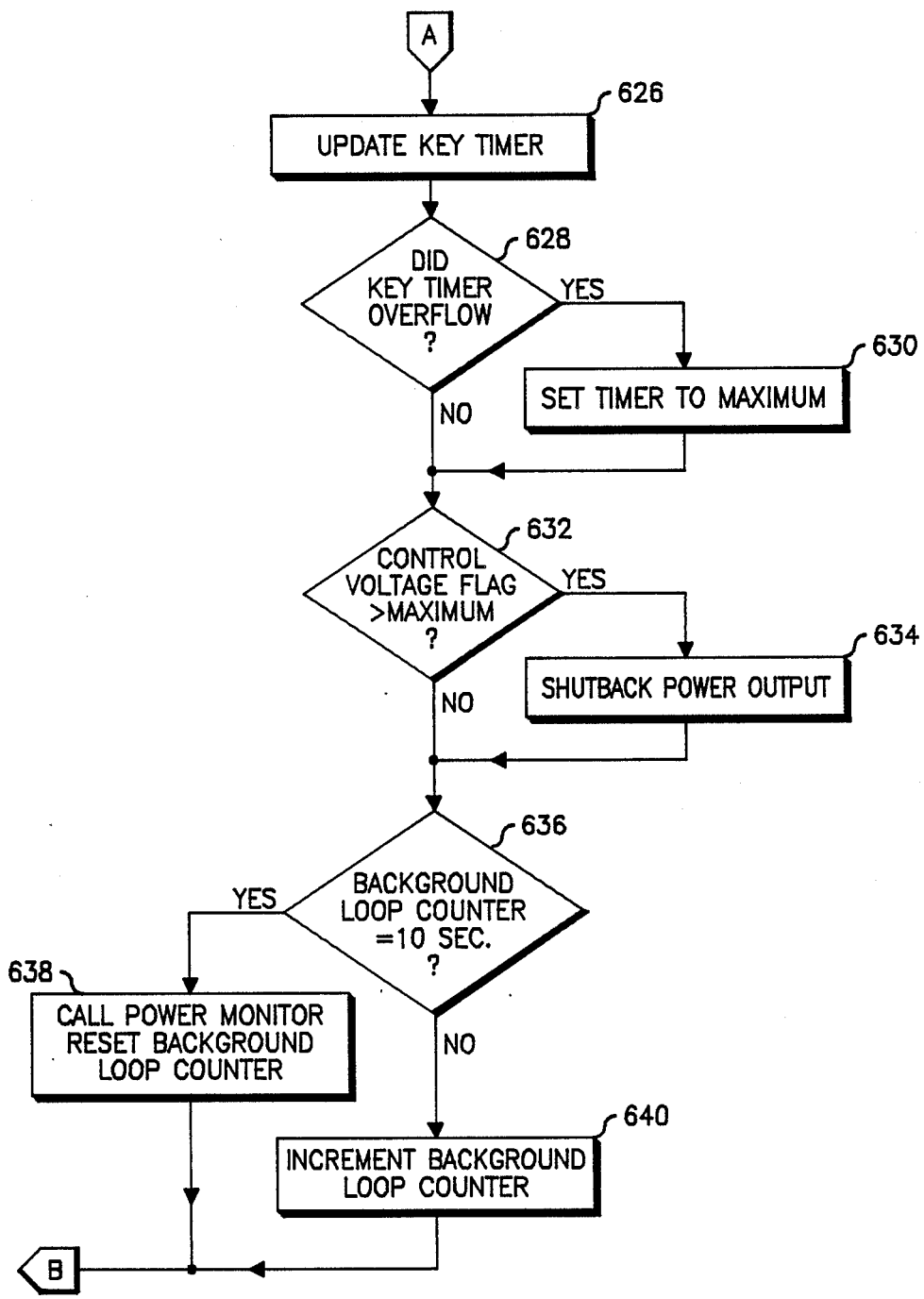

Turning now to FIGS. 6A and 6B, flowchart 600 summarizes the method steps utilized in the preferred embodiment. Upon power up, the method initializes everything which is a variable, represented by blocks 602 and 604, respectively. Next, the method checks to see if the PTT status has changed, as represented at block 606. If the status has changed and the transmitter is on, the method calls the Key subroutine, as represented along YES paths to block 608 and block 610, respectively. This Key subroutine will be described in further detail in FIG. 7A. However, if the transmitter was not keyed, then the Dekey subroutine is called, as represented at block 612. This Dekey subroutine 612 will be described later in conjunction with FIG. 7B.

Upon completing either of these subroutines, the method then checks to see whether 17 milliseconds (mS) has elapsed since the start of the background loop, as represented at block 614. If this amount of time has not elapsed, it waits until this described time has elapsed, as represented by NO path back to the input of block 614. For purposes of simplification, 17 mS represents a rounding of the actual 16.9 mS used in the preferred embodiment.

If, however, the method determined that PTT status had not changed, as represented via NO path from block 606, then it again checks to see if the transmitter is keyed, as shown at block 616. If the transmitter is not keyed, it updates a dekey timer which keeps track of an interval of time such as T1-T2 from FIG. 5B, and shown at block 618. Next, the method checks to see if the dekey timer overflowed, and if it has, the method sets the timer to maximum, as shown at blocks 620 and 622, respectively. Upon setting this timer to maximum, or finding the dekey timer has not overflowed, the method proceeds to do other housekeeping chores, represented by block 624, and also checks to see whether 17mS have elapsed since the start, as shown at block 614. If, however, the transmitter is keyed, as determined at a condition statement represented by block 616 and the Yes path, the method updates a Key timer, represented by block 626 in FIG. 6B. Then, determining that the key timer overflowed, the method sets the timer to maximum, as shown by condition blocks 628 and block 630, respectively Upon setting the timer to maximum, or determining that the key timer did not overflow, the method checks whether the control voltage as currently set exceeds a maximum, as shown at block 632. If this maximum has been exceeded, then the power output is shut back according to any number of possible algorithms, as represented at block 634.

Upon shutting back the power out level or determining that the control voltage does not exceed the maximum, the method next checks to see if the background loop counter equals 10 seconds. If it does, the method calls the power monitor subroutine and then resets the background loop counter, as shown by condition block 636 and block 638, respectively If, however, the background loop counter does not equal 10 seconds, the method increments the background loop counter, shown at block 640, and then checks whether 17 mS has elapsed since the start, as shown at block 614 in FIG. 6A. Similarly, after resetting the background loop counter, as shown at block 638, the method also checks whether 17mS has elapsed, as represented in block 614. Once this 17mS has elapsed, it checks whether the PTT status has changed again, as represented at block 606, and reached via YES path 615. In this way the method repeatedly checks the status change of the PTT every 17mS to update the calculated PA temperature and the proper power output level instruction to be sent to the digital to analog converter (DAC) 216, and checks the background loop counter every 10 seconds to provide automatic shutback of the power output during any perceived fault conditions.

Figure 7A:
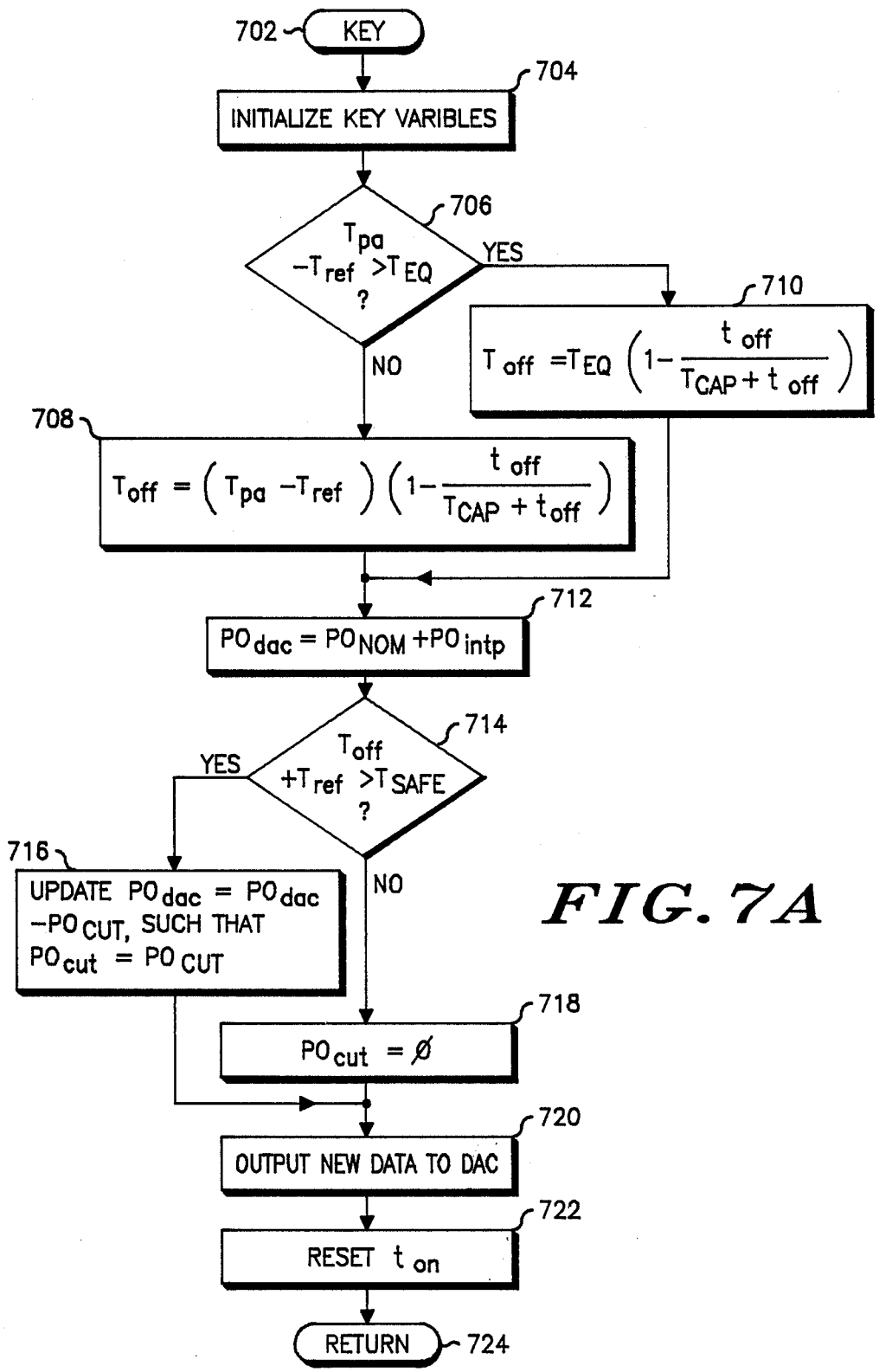
FIG. 7A, 7B, and 7C depict a set of additional flowcharts which describe in greater detail the subroutines utilized in FIG. 6A and B.

Turning now to FIG. 7A, the Key subroutine 610 is shown in which the method begins at a starting point and initializes key variables, as represented at block 702 and 704, respectively. Next, it checks to see if the temperature difference between the PA temperature and the reference temperature exceeds $T_{EQ}$, the thermal equilibrium temperature difference, as represented at condition block 706. The method next calculates a value of temperature, $T_{off}$, in proportion to a factor which is based on an approximation for an exponential curve given earlier as equation (3):

$$(1-(t_{off}/T_{CAP}+t_{off})),$$

as represented at blocks 708 and 710. If the thermal equilibrium constant was not exceeded, then, as shown at block 708, the proportionality factor utilized as the second factor is $(T_{pa}-T_{ref})$, as given at bock 708.

If however, the thermal equilibrium constant has been exceeded, then, as shown at block 710, the proportionality factor is merely equal to $T_{eq}$, as shown. Next, as depicted at block 712, a value is assigned to the variable, $PO_{dac}$, which represents an instruction for nominal (or full) power output for a given frequency which has been adjusted for any power versus frequency variations across the operating band by $PO_{intp}$. Next, a check is made to see whether the combined temperatures of the reference and the OFF temperature computed above exceed the safe temperature, $T_{SAFE}$, as depicted at condition block 714. If this safe temperature is exceeded, then an instruction is given to the DAC to update the power output by introducing an incremental amount of power cut, $PO_{CUT}$, as shown at block 716. If the safe temperature has not been exceeded, then the method merely maintains the nominal or full power output, since the total power cutback is equal to 0, as shown at block 718. The new output power level is sent as binary data to the DAC, as represented at block 720. The method then resets the variable key time, $t_{on}$, and then returns, as depicted at block 722 and block 724, respectively.

Figure 7B:
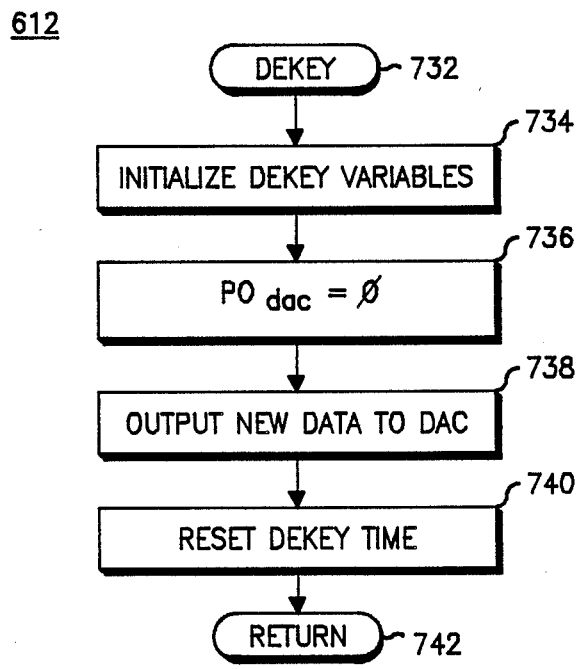
Figure 7C:
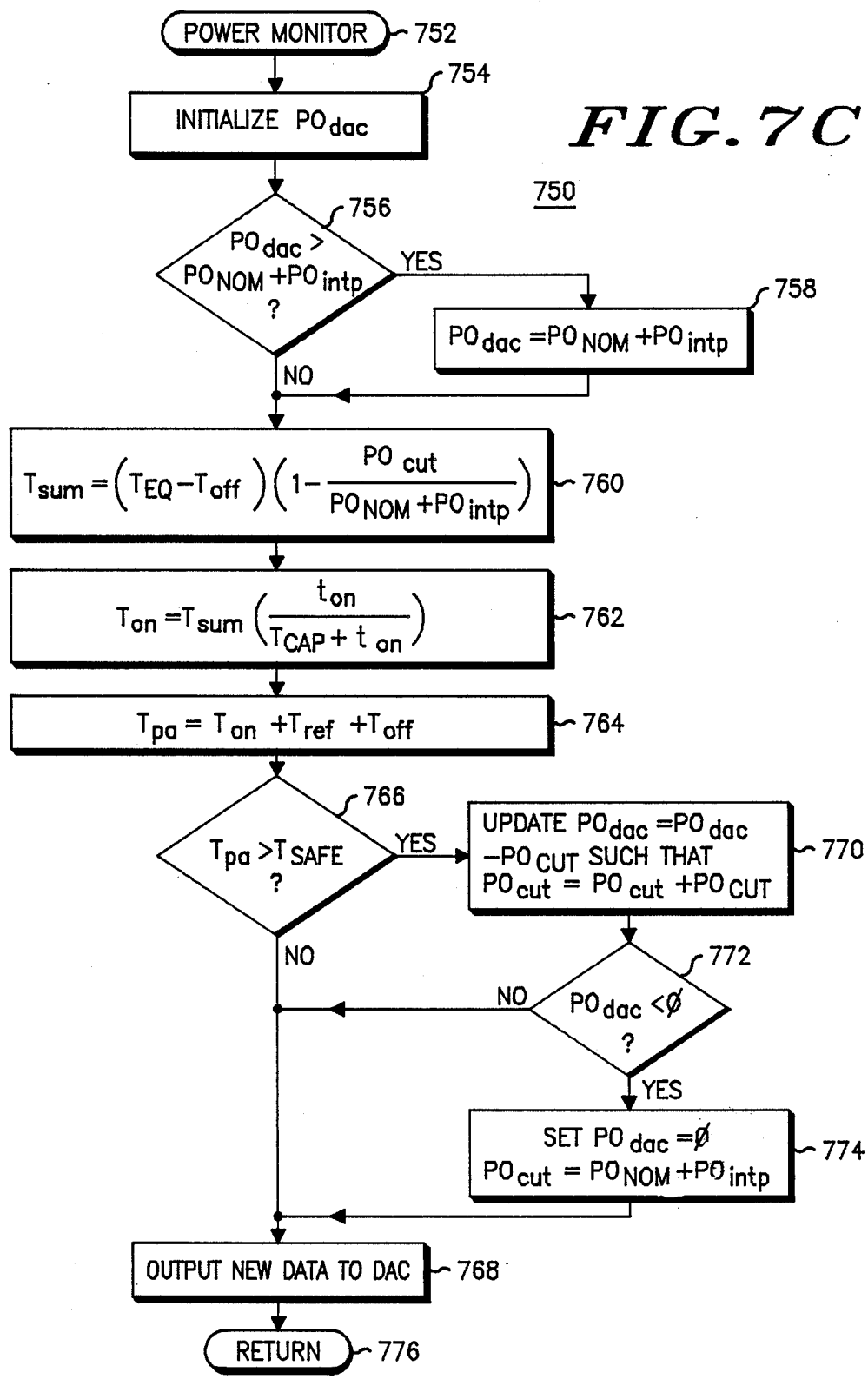

Dekey subroutine 612 is depicted in FIG. 7B. This subroutine begins at a starting point and initializes Dekey variables, as represented at block 732 and 734, respectively. The method then sets the power level from the DAC equal to zero and outputs this new data to the DAC, as represented at block 736 and 738, respectively. Then the subroutine resets the dekey time, or $t_{off}$, and then returns, as represented at block 740 and 742, respectively Finally, the power monitor subroutine is depicted at 750 in FIG. 7C as shown. This subroutine 750 forms a part of the instructions as represented at block 638 of the simplified control loop 600 given in FIG. 6. The subroutine begins at a starting point and initializes the power level of the DAC, as represented at block 752 and 754, respectively. Next, the subroutine checks to see whether the power level as set by the DAC exceeds the nominal plus interpolated power output levels appropriate for this particular radio model, as represented at condition block 756. If the present power level of the DAC is determined to exceed the assigned power level for this particular radio model, then the subroutine sets the power level of the DAC equal to the proper power level, as represented at block 758. With a proper power level in the DAC, the subroutine next calculates the variable thermal sum, $T_{sum}$, which is used in a following step to determine the temperature during the on, or key time $T_{on}$, as represented at block 760 and 762, respectively. Next, the temperature of the PA is calculated as $$T_{pa} = T_{on} + T_{ref} + T_{off}$$

as depicted at block 764. Then, the subroutine checks to see if the temperature of the PA exceeds a safe operating temperature limit, $T_{SAFE}$, as represented at condition block 766.

If this safe temperature limit is not exceeded, then the subroutine permits output of the new data to the DAC, as represented at block 768. If, however, the PA temperature exceeds the safe operating temperature, then the subroutine updates the power level of the DAC to a reduced level as represented at block 770, and then applies a reasonableness test to determine if this updated power level of the DAC is less than 0, as represented at condition block 772. If this updated power output level of the DAC is not less than 0, the subroutine proceeds in the usual way to output the new data to the DAC per block 768. On the other hand, if this updated power level of the DAC is less than 0, then the subroutine sets the power level of the DAC equal to 0, or equivalently, the amount of power level cutback is equal to the full amount, as represented at block 774. Then after providing whichever updated power level to the DAC has been accomplished at block 768, the subroutine then proceeds to return to the main set of instructions as represented by point 776.

Throughout the above discussion of the preferred embodiment, control of a power amplifier in a mobile radio has been described in which a remote temperature sensor and the key/dekey, or on/off times are utilized in conjunction with predetermined thermal time constants to project the temperature of the devices in the power amplifier and effect a maximum amount of permissible output power which adapts to randomly varying message sequences. As will be recognized by one of skill in the art, various alternate embodiments are contemplated from the above, in which, for example, an audio power amplifier is controlled by a remote sensor and the duty cycle of the audio signals passed therethrough.

Although the arrangement of the present invention fully discloses many of the attendant advantages, it is understood that various changes and modifications not depicted herein are apparent to those skilled in the art. Therefore, even though the form of the above-described invention is merely a preferred or exemplary embodiment given with a suggested alternative, further variations may be made in the form, construction, and arrangement of the parts without departing from the scope of the above invention.

We claim:

1. A method for automatically ensuring a safe operating temperature for electronic equipment having heat-dissipating devices operated intermittently over a period of time, the method comprising the steps of:
   (a) measuring present operating temperature within the electronic equipment at a location remote from the heat-dissipating device and elapsed time associated with a first and a second state of intermittent operation of the heat-dissipating devices;
   (b) calculating a projected temperature for the heat-dissipating devices based upon a stored, predetermined thermal model which utilizes said measured operating temperature and said elapsed time, and an operating power level associated with the heat-dissipating devices; and
   (c) adjusting said operating power level to a maximum permissible point within a range of operating power levels so that said projected temperature does not exceed a preset limit, thereby ensuring a safe operating temperature for the electronic equipment while providing a permissible maximum operating power level.

2. The method according to claim 1, wherein said step of measuring present operating temperature at a location remote from the heat-dissipating devices comprises measuring temperature at a location remote from an included heatsink onto which the heat-dissipating devices are mounted.

3. The method according to claim 1, wherein said step of measuring present operating temperature includes measuring ambient temperature and measuring an elapsed time includes timing an elapsed time associated with either of said first or said second state of intermittent operation.

4. The method according to claim 1, wherein said step of measuring present operating temperature includes measuring ambient air temperature within another included component, and measuring an elapsed time includes timing an elapsed time associated with either of said first or second state of intermittent operation.

5. The method according to claim 1, wherein said step of calculating a projected temperature includes utilizing a first and a second exponential equation for said first and second states of intermittent operation, as follows:

$T_{on} = T_{EQ}[1 - e^{-t_{on}/T_{CAP}}]$, and
$T_{off} = T_{on}[e^{-t_{off}/T_{CAP}}]$, where:

$T_{on}$ ($= T_{EQ}$ as $t_{on} \to \infty$) is the temperature rise of the devices above reference temperature, and $T_{off}$ ($= 0$ as $t_{off} \to \infty$) is the temperature fall of the devices with respect to the reference temperature, and where the thermal constants of the thermal model are:

$T_{CAP}$ ($= R_{th}C_{th}$) is the thermal time constant;

$R_{th}$ is the thermal resistance of a path between devices and reference; and $C_{th}$ is the thermal capacitance of this path.

6. The method according to claim 1, wherein said step of calculating a projected temperature includes approximating a first and a second equation for the projected temperature difference above the reference temperature during said first and second states of intermittent operation as follows:

$$T_{on} = [T_{SUM}[t_{on}/(T_{CAP}+t_{on})]$$
$$T_{off} = [T_{pa}-T_{ref}][1-t_{off}/(T_{CAP}+t_{off})]$$

where $T_{on}$ (= $T_{EQ}$ as $t_{on} \rightarrow \infty$) is the temperature rise of the devices above reference temperature;

$T_{SUM} = [T_{EQ}-T_{OFF}-T(p.o. \text{ decrease})]$, which represents a modified equilibrium constant, where $T_{EQ}$ is the thermal equilibrium constant for full power and $t \rightarrow \infty$; $T_{OFF}$ is the temperature above reference at the conclusion of the last "off" state; and T(p.o. decrease) is the temperature fall due to power decrease;

$T_{CAP}$ (= $R_{th}C_{th}$) is the thermal model time constant;

$T_{off}$ (=0 as $t_{off} \rightarrow \infty$) is the temperature fall of the devices with respect to the reference temperature;

$T_{pa} = T_{ref} + T_{ON}$, where $T_{off}$ is temperature fall during the "off" condition, and $T_{ON}$ is the temperature above reference at the conclusion of the last "on" state.

7. The method according to claim 6, wherein said first and second equations utilize a plurality of piece-wise linear approximations to permit a microcontroller to rapidly determine said projected temperature.

8. The method according to claim 1, wherein said step of adjusting the operating power level includes decrementing, through a plurality of steps, the operating power level of the heat-dissipating devices.

9. The method according to claim 1, wherein said step of adjusting the operating power level includes 128 steps for decrementing the operating power level of the heat-dissipating devices.

10. Apparatus for automatically ensuring a safe operating temperature for electronic equipment having heat-dissipating devices which are operated intermittently over a period of time, the apparatus comprising:
   (a) means for measuring, at a location within the electronic equipment which is remote from the heat-dissipating devices, present operating temperature and an elapsed time associated with a first or a second state of intermittent operation thereof;
   (b) means for calculating a projected temperature for the heat-dissipating devices based upon a stored, predetermined thermal model which utilizes said measured temperature and said elapsed time, and an operating power level associated with the heat-dissipating devices; and
   (c) means for adjusting the operating power level to a maximum permissible point within a range of operating power levels so that said projected temperature does not exceed a preset limit, thereby ensuring a safe operating temperature for the electronic equipment while providing a permissible maximum operating power level.

11. The apparatus according to claim 10, wherein said means for measuring present operating temperature includes a thermistor which serves to temperature compensate another device, such as an included reference oscillator, and said means for measuring an elapsed time includes timer means having at least one resettable counter for clocking an interval of time corresponding to the duration of either of said first or said second state of intermittent operation.

12. The apparatus according to claim 10, wherein said means for calculating a projected temperature includes a microcontroller and a memory having a stored, predetermined thermal model therein.

13. The apparatus according to claim 10, wherein said means for adjusting the operating power level includes a controller having a D/A converter, a comparator, and a voltage control transistor stage.

14. An improved thermal protection circuit for a mobile radio that includes RF power devices which are mounted on a finite heatsink and operated intermittently over a period of time, the circuit comprising in combination:
   (a) a thermistor placed at a location within the mobile radio which is remote from the finite heatsink;
   (b) a timer having at least one resettable counter for clocking an elapsed time associated with a keyed (ON) or a dekeyed (OFF) state of the RF devices;
   (c) a microcontroller, coupled to said thermistor and said timer having at least one resettable counter, that includes a stored, predetermined thermal model which utilizes said temperature measured by (a) said elapsed time clocked by (b) and an operating power level associated with the RF power devices to calculate a projected operating temperature for the RF power devices; and
   (d) a controller, coupled to said microcontroller, which permits said microcontroller to step-wise adjust the operating power level to a permissible maximum point in a range of operating power levels so that said projected temperature does not exceed a preset limit, thereby ensuring a safe operating temperature for the mobile radio while providing a permissible maximum operating power level.

15. The improved thermal protection circuit according to claim 14, wherein said thermistor comprises an already existing thermistor which is part of an included temperature compensated reference oscillator which is located an appreciable distance from the heatsink and within the mobile radio.

16. The improved thermal protection circuit according to claim 15, wherein said at least one resettable counter comprises two resettable counters that reset upon a change of state from a keyed (ON) or a dekeyed (OFF) condition and measure an interval of time corresponding to the duration of said keyed (ON) or said dekeyed (OFF) condition of the RF power devices.

17. The improved thermal protection circuit according to claim 14, wherein said microcontroller includes a microprocessor, an A/D converter, timers, and a memory block.

18. The improved thermal protection circuit according to claim 14, wherein said controller includes a D/A converter, a comparator, and a voltage control transistor stage constructed and arranged to provide a control voltage to the RF power amplifier.

19. A mobile radio having an improved thermal protection circuit for RF power devices mounted on a finite heatsink attached thereto and operated intermittently over a period of time, the mobile radio comprising in combination:
   (a) transceiving means, including:
      transmitting means having at least an exciter and an RF power amplifier;
      receiving means;
      temperature compensated reference oscillator means, coupled to said exciter means and said receiving means, including a thermistor located therein;
   (b) at least one resettable counter for clocking an elapsed time associated with a keyed or a dekeyed condition of the RF power devices;

(c) a microcontroller, coupled to said thermistor and said resettable counter, having a stored, predetermined thermal model which utilizes a temperature measured by said thermistor, said elapsed time clocked by (b), and an operating power level associated with the RF power devices to calculate a projected temperature for the RF power devices; and (d) a digital power controller, interposed between said RF power amplifier and said microcontroller, which permits step-wise adjustment of the operating power level to a maximum permissible point within a range of operating power levels so that said projected temperature does not exceed a preset limit, thereby ensuring a safe operating temperature for the mobile radio while providing a higher operating power level over the period of time and permitting a significantly smaller finite heatsink to be utilized.

20. An improved thermal protection circuit for an audio power amplifier having heat-dissipating devices which are mounted on a finite heatsink and operated intermittently over a period of time, the circuit comprising in combination:

(a) a thermistor placed at a location within the audio power amplifier which is remote from the heat-dissipating devices;

(b) at least one resettable counter for clocking an elapsed time associated with an on and an off state of the heat-dissipating devices;

(c) a microcontroller, coupled to said thermistor and said at least one resettable counter, having a stored, predetermined thermal model which utilizes said temperature measured by (a), said elapsed time clocked by (b), and an operating power level associated with the heat-dissipating devices, to calculate a projected operating temperature for the heat-dissipating devices; and (d) a controller, interposed between said microcontroller and said devices, to step-wise adjust the operating power level to a permissible maximum point within a range of operating power levels so that said projected temperature does not exceed a preset limit, thereby ensuring a safe operating temperature for the audio power amplifier while providing a permissible maximum operating power level.

21. A method for adaptively controlling the power output of heat-dissipating devices so that a preset limit corresponding to a safe operating temperature is not exceeded, the method comprising the steps of:

(a) measuring temperature at a remote location other than at the heat-dissipating devices;

(b) measuring elapsed time associated with a first and a second state of operation of the heat-dissipating devices;

(c) calculating a projected temperature based upon a stored, predetermined thermal model which utilizes said measured temperature in step (a), said elapsed time in step (b), and an operating power level of the heat-dissipating devices; and (d) adjusting the operating power level so that said projected temperature does not exceed the preset limit, to maximize the operating power level of, and to ensure a safe operating temperature for, the heat-dissipating device.

22. Apparatus for adaptively controlling the power output of heat-dissipating devices so that a preset limit corresponding to a safe operating temperature is not exceeded, the apparatus comprising:

(a) means for measuring temperature at a remote location other than at the heat-dissipating devices;

(b) means for measuring elapsed time associated with a first and a second state of operation of the heat-dissipating devices;

(c) means for calculating a projected temperature based upon a stored, predetermined thermal model which utilizes said temperature measuring means, said elapsed time measuring means, and an operating power level of the heat-dissipating devices; and (d) operating power level adjusting means, coupled to said calculating means, for adjusting the operating power level so that said projected temperature does not exceed the preset limit, to maximize the operating power level of, and to ensure a safe operating temperature for, the heat-dissipating devices.

* * * * *